United States Patent
Zimmerman (10) Patent No.: US 7,177,211 B2
(45) Date of Patent: Feb. 13, 2007

(54) MEMORY CHANNEL TEST FIXTURE AND METHOD

(75) Inventor: David Zimmerman, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/713,673

(22) Filed: Nov. 13, 2003

(65) Prior Publication Data
US 2005/0105350 A1    May 19, 2005

(51) Int. Cl.
*G11C 7/00* (2006.01)
(52) U.S. Cl. .................... 365/201; 365/189.05
(58) Field of Classification Search ......... 365/189.05, 365/201, 189.09, 51
See application file for complete search history.

(56) References Cited

U.S. PATENT DOCUMENTS

| | | | | |
|---|---|---|---|---|
| 5,398,325 A | * | 3/1995 | Chang et al. | 711/3 |
| H1507 H | * | 12/1995 | Hendrickson et al. | 710/71 |
| 5,831,890 A | * | 11/1998 | Selna et al. | 365/51 |
| 5,973,951 A | * | 10/1999 | Bechtolsheim et al. | 365/52 |
| 6,185,644 B1 | | 2/2001 | Farmwald et al. | |
| 6,263,390 B1 | * | 7/2001 | Alasti et al. | 710/308 |
| 6,317,352 B1 | | 11/2001 | Halbert et al. | |
| 6,345,321 B1 | | 2/2002 | Litaize et al. | |
| 6,369,605 B1 | | 4/2002 | Bonella et al. | |
| 6,493,250 B2 | | 12/2002 | Halbert et al. | |
| 6,502,161 B1 | | 12/2002 | Perego et al. | |
| 6,625,687 B1 | | 9/2003 | Halbert et al. | |
| 6,643,752 B1 | | 11/2003 | Donnelly et al. | |
| 2002/0184579 A1 | | 12/2002 | Alvarez, II et al. | |
| 2004/0049649 A1 | | 3/2004 | Durrant | |

FOREIGN PATENT DOCUMENTS

| | | |
|---|---|---|
| WO | WO 99/30240 | 6/1999 |
| WO | WO 99/41666 | 8/1999 |
| WO | WO 99/41667 | 8/1999 |

OTHER PUBLICATIONS

SBS Implementers Forum; *System Management Bus Specification*; Aug. 3, 2000; pp. 1-59.
Atmel Corporation; *2-Wire Serial EEPROM Revision 0180D*; Oct. 1998; pp. 1-21.
Intel Corporation; *PC SDRAM Serial Presence Detect Specification Revision 1.2B*; Nov. 1999; pp. 1-30.

\* cited by examiner

*Primary Examiner*—Thong Q. Le
(74) *Attorney, Agent, or Firm*—Marger Johnson & McCollom, PC (57) ABSTRACT

Method and apparatus for use with buffered memory modules are included among the embodiments. In exemplary systems, the memory module has a host-side memory channel port and a downstream memory channel port, allowing multiple modules to be chained point-to-point. In the present disclosure, a separate bus, such as a low-speed system management bus, connects to a memory module buffer. In response to commands received over the system management bus, the memory module can initiate commands and transmit those commands over its downstream memory channel port as if the commands originated from a host connected to the host-side memory channel port. This functionality allows module-to-module memory channels and memory modules to be tested independent of a host memory controller and host memory channel. Other embodiments are described and claimed.

37 Claims, 6 Drawing Sheets

MEMORY CHANNEL TEST FIXTURE AND METHOD

FIELD OF THE INVENTION

This present invention relates generally to memory systems, components, and methods, and more particularly to functionality for testing memory module buffers, buffered memory channels, and buffered memory modules independent of a host memory controller and host memory channel.

BACKGROUND

Digital processors, such as microprocessors, use a computer memory subsystem to store data and processor instructions. Some processors communicate directly with memory, and others use a dedicated controller chip, often part of a "chipset," to communicate with memory.

Figure 1:
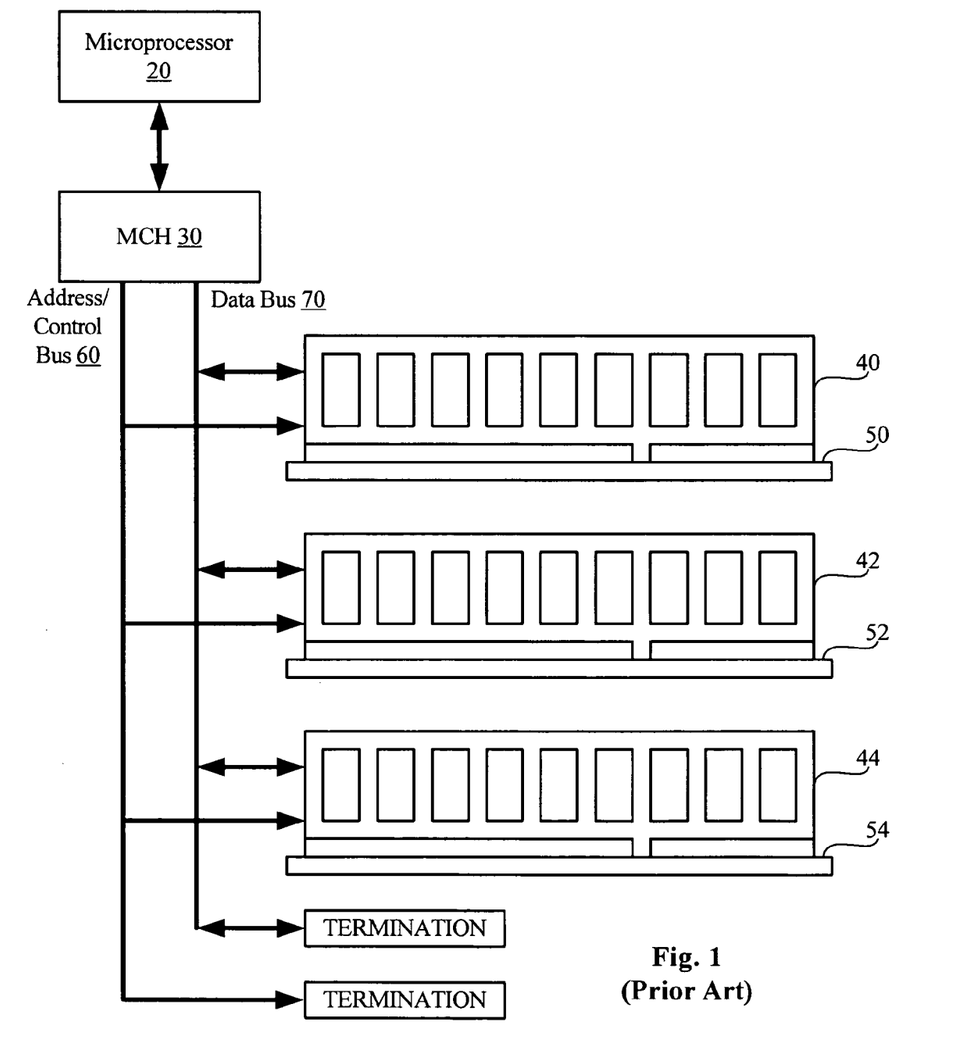
FIG. 1 illustrates a prior art computer memory subsystem.

Conventional computer memory subsystems are often implemented using memory modules. Referring to FIG. 1, a microprocessor 20 communicates with a memory controller/hub (MCH) 30 that couples the microprocessor 20 to various peripherals. One of these peripherals is system memory, shown as memory modules 40, 42, and 44 inserted in card slots 50, 52, and 54. When connected, the memory modules are addressed from MCH 30 whenever MCH 30 asserts appropriate signals on an Address/Control Bus 60. Data transfers between MCH 30 and one of memory modules 40, 42, and 44 occur on a Data Bus 70. Address/Control Bus 60 and Data Bus 70 are referred to as "multi-drop" buses due to their use of multiple bus stubs for each memory module.

In this prior art system, MCH 30 initiates all memory transactions, all memory write data passes through MCH 30 to the modules, and all memory read data passes through MCH 30 to reach microprocessor 20 or another peripheral (not shown) performing a direct memory access. Absent a functioning MCH or a special purpose prototype MCH, it is impossible to evaluate the performance of address/control bus 60, data bus 70, and the memory modules.

BRIEF DESCRIPTION OF THE DRAWING

The embodiments may be best understood by reading the disclosure with reference to the drawing, wherein.

DETAILED DESCRIPTION OF THE EMBODIMENTS

This description describes various test configurations, memory components, and methods for testing memory modules and memory module buffers independent of a memory controller and/or a memory channel to a memory controller. These embodiments are useful with what are referred to herein as "buffered memory modules, which have a buffer that isolates memory device on the module from a host memory bus."

Figure 2:
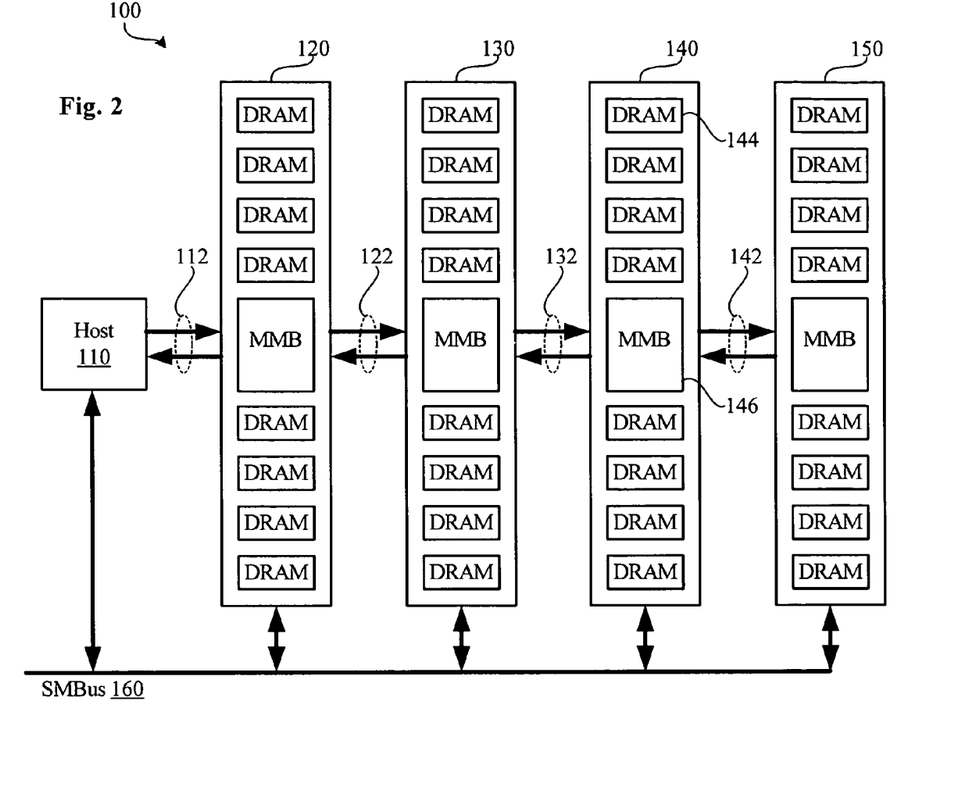
FIG. 2 shows a memory subsystem according to some embodiments of the present invention.

Referring to FIG. 2, a buffered-memory-module memory subsystem 100 is shown, comprising a host 110, four buffered memory modules 120, 130, 140, and 150, four memory channels 112, 122, 132, and 142, and a low-speed system management bus 160. Host 110 can include one or more microprocessors, signal processors, memory controllers, graphics processors, etc. Typically, a memory controller coordinates access to system memory, and the memory controller will be the component of host 110 connected directly to the host memory channel 112.

Buffered memory module 140 is typical of the memory modules. A memory module buffer (MMB) 146 connects module 140 to a host-side memory channel 132 and to a downstream memory channel 142. A plurality of memory devices (Dynamic Random Access Memory Devices, or "DRAMs" like DRAM 144, are shown) connect to memory module buffer 146 through a memory device bus (not shown in FIG. 2) to provide addressable read/write memory for subsystem 100.

Figure 3A:
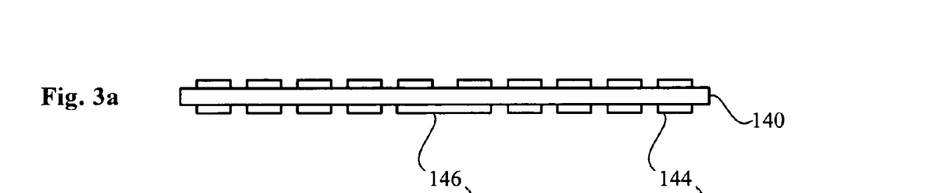
FIGS. 3a and 3b illustrate the physical appearance of a fully-buffered Dual Inline Memory Module (DIMM) according to some embodiments of the present invention.
Figure 3B:
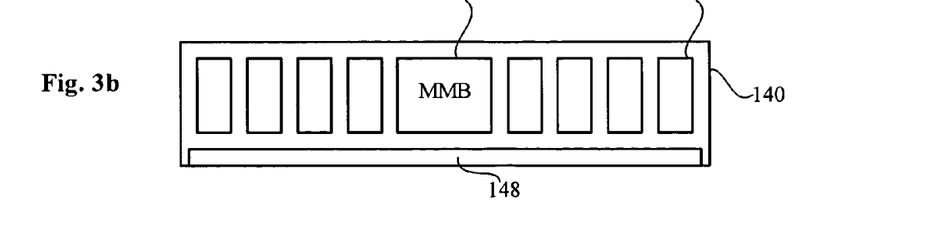

FIGS. 3a and 3b show one possible physical appearance for DIMM embodiments of memory module 140. A set of card edge connectors 148 provide electrical connection for host-side and downstream memory channels, reference voltages, clock signals, SMBus 160, etc. MMB 146 is centrally located on one side of module 140, flanked on each side by four DRAM devices 144. Ten more DRAM devices occupy the opposite side of module 140. The electrical connections present on the module will be explained below with reference to FIG. 5.

Each memory channel in FIG. 2 is a point-to-point connection between two devices, either two MMBs or the host and an MMB. The direct connection allows the memory channels to run preferably at extremely high data rates, e.g., at speeds that would not be possible with a multi-drop bus that has a high capacitive loading and multiple stubs.

Host 110 accesses the memory space of module 140 by sending a command, addressed to memory module 140, out on host memory channel 112. The MMB of buffered memory module 120 receives the command and resends it on memory channel 122 to the MMB of buffered memory module 130. The MMB of buffered memory module 130 next receives the command and resends it on memory channel 132 to MMB 146. MMB 146 detects that the command is directed to it, decodes it, and transmits DRAM commands and signaling to the DRAMs (e.g., 144) controlled by that buffer. When a response is expected (such as when a read is requested), MMB 146 receives the data from the DRAMs, encodes/formats the data, and sends it backwards along the memory channels to host 110.

In a memory subsystem such as subsystem 100, it has now been found desirable to provide for testing and evaluation of individual memory modules and individual module-to-module memory channels independent of the host and host memory channel. For instance, it may be desirable to test MMB performance and features and settle on a buffer design before attempting to build a memory controller to work with those MMBs. Further, a memory controller or prototype memory controller may not initially work, given the challenging signaling problems present in memory subsystems or a prototype buffer may be only partially functional. It may be desirable to test memory modules during manufacturing independent of a particular system implementation.

To provide a capability for solving these and or similar problems, the MMB embodiments, test fixtures, and memory subsystems described herein provide a separate reliable channel to allow testing independent of a memory controller and/or host memory channel. For instance, FIG. 2 illustrates a control bus (SMBus 160) routed to the host 110 and to each of the buffered memory modules 120, 130, 140, and 150. Although proprietary or other standard buses or signaling can be used in a particular embodiment, an Smbus is illustrated in FIG. 2. An SMBus is a particular type of control bus that conforms to the System Management Bus (SMBus) Specification, SBS Implementers Forum, Version 2.0, Aug. 3, 2000. SMBus 160 provides a reliable low-speed (10 to 100 kbps) serial channel that is typically used in a computer to control peripherals such as a battery management system, fans, laptop display settings, etc.

In FIG. 2, SMBus 160 connects to each MMB. Host 110 or another device (not shown) can use SMBus 160 to issue commands directly to one of the memory modules, effectively bypassing host memory channel 112 and any intervening module-to-module memory channels and memory modules. For instance, SMBus 160 can be used to instruct MMB 146 to test its attached memory by issuing a series of reads and writes. If a memory buffer supports such operations it may be instructed to issue commands to other DIMMs. For example, a buffer might be instructed to initiate a write command over memory channel 142 to a location on memory module 150, and then initiate a read command to the same memory location to verify the proper operation of memory channel 142 and/or memory module 150. Alternatively a buffer chip may be instructed to issue low level tests of the DIMM to DIMM interconnect by sending a stream of data to a target DIMM. The target DIMM may be instructed to examine the data stream for errors or return data to the initiating DIMM for evaluation. Other test modes are possible depending on the desired nature of the test and the test methods supported by a given buffer design. Although the data rate available over SMBus 160 is a tiny fraction of the memory channel data rate, control circuitry in memory module buffer 146 can respond to an SMBus command with full-data-rate memory channel transactions. This control circuitry is explained next, with reference to FIG. 4.

Figure 4:
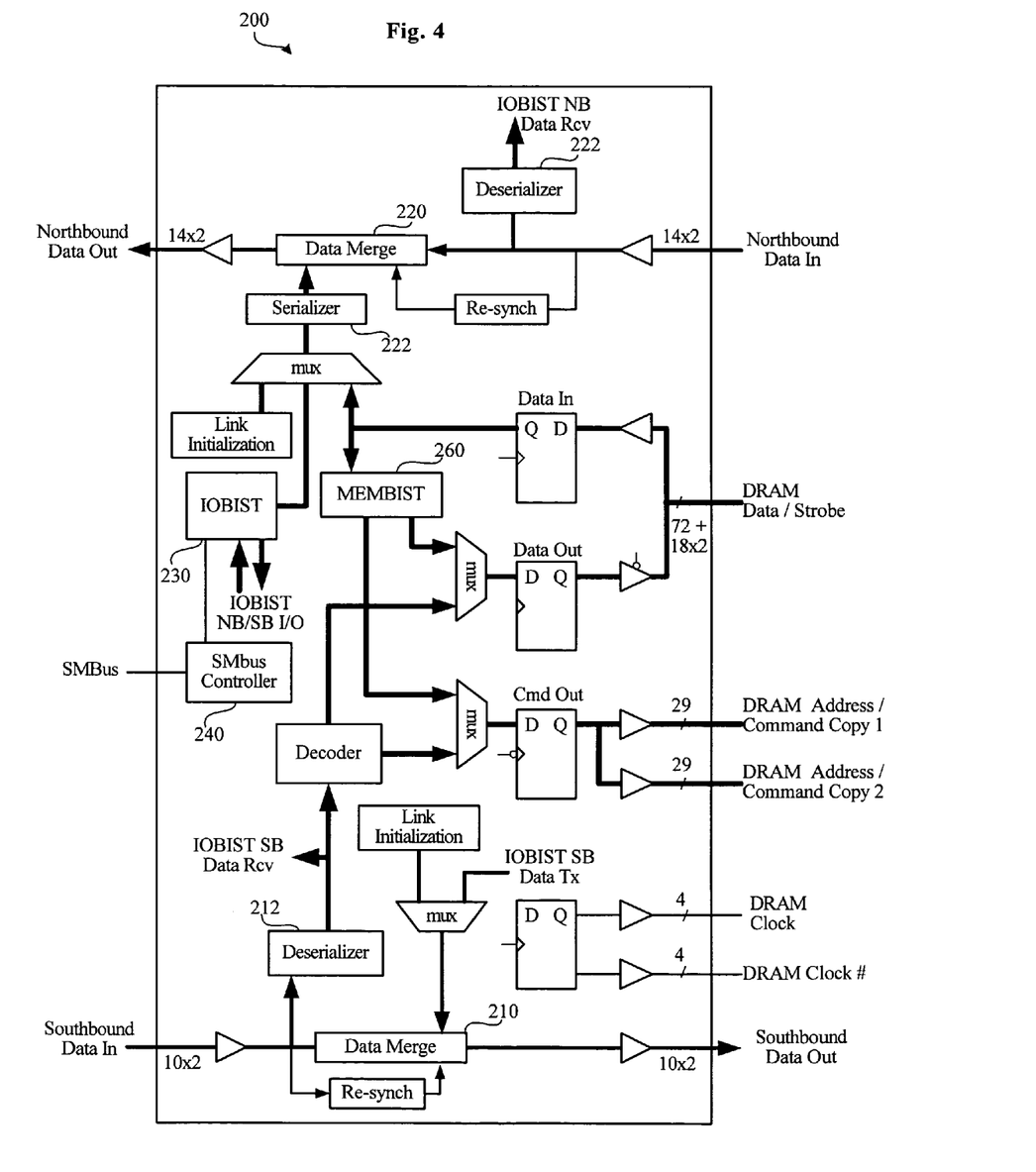
FIG. 4 shows the internal architecture of a memory module buffer according to some embodiments of the present invention.

FIG. 4 shows a block diagram for a memory module buffer 200 according to some embodiments of the present invention. Memory module buffer 200 maintains a substantial number of external connections. Various buffers, flip-flops, receivers, and drivers facilitate signaling on these connections, although further description of these circuit elements is omitted as not critical to the understanding of the embodiments.

Several of the functional blocks included in memory module buffer 200 are important to the embodiments. Each will be described in turn.

Data Merge block 210 normally receives data from the host-side memory channel port Southbound Data In and repeats that data out on the downstream memory channel port Southbound Data Out. Deserializer 212 reads the data passing through block 210, which may in fact be directed at buffer 200. An Input/Output Built-In Self Test (IOBIST) southbound (SB) Data Transmit input to block 210 has the capability to override the normal Southbound Data input. This embodiment uses the IOBIST SB Data Transmit output to capture the downstream memory channel and perform tests, as will be described below.

Data Merge block 220 and Deserializer 222 function in the northbound data path similar to blocks 210 and 212 in the southbound data path. An IOBIST Northbound (NB) Data Receive channel allows MMB 200 to receive reply and result messages to IOBIST commands transmitted on the Southbound Data Output.

IOBIST block 230 and SMBus Controller 240 provide a path for initiating commands that cause MMB 200 to exercise its downstream memory channel, by injecting commands and/or data at block 210 and receiving memory channel responses at blocks 220 and 222. Test commands that are unavailable from the memory controller are possible. For instance, IOBIST 230 can be instructed to perform a write/read pattern test on downstream memory, using an internal pattern generator, address counter, and comparator (not shown), and then report success/failure back to the SMBus device that requested the pattern test. IOBIST 230 can be instructed to continually exercise the memory channel until instructed otherwise, while memory channel waveforms are observed and/or bit error rates are calculated. These exemplify the wide range of test conditions that can be designed into IOBIST 230.

IOBIST 230 can also be commanded from the SMBus to test its host-side memory channel. In a host-side memory channel test, for instance, data received at the Southbound Data In port is forwarded to IOBIST 230. IOBIST 230 can then perform some commanded function, such as repeating the data to the NB Data Out port. One possible test is to set a downstream MMB to this host-side memory channel test mode, and then set an upstream MMB to a downstream memory channel test mode, allowing the memory channel between the two to be verified in a loopback configuration.

MEMBIST block 260 supplies memory write data to the Data Out path when data is to be written to the memory devices, and receives memory device read data from the DRAMs over the Data In path when data is read from the memory devices. MEMBIST block 260 will then compare the returned data to the expected data to determine if there is an error in the DRAM or along the connection from the AMB to the DRAM. This test may be initiated from the SMBus or from the host-side interface in a manner similar to the initiation of other tests.

Figure 5:
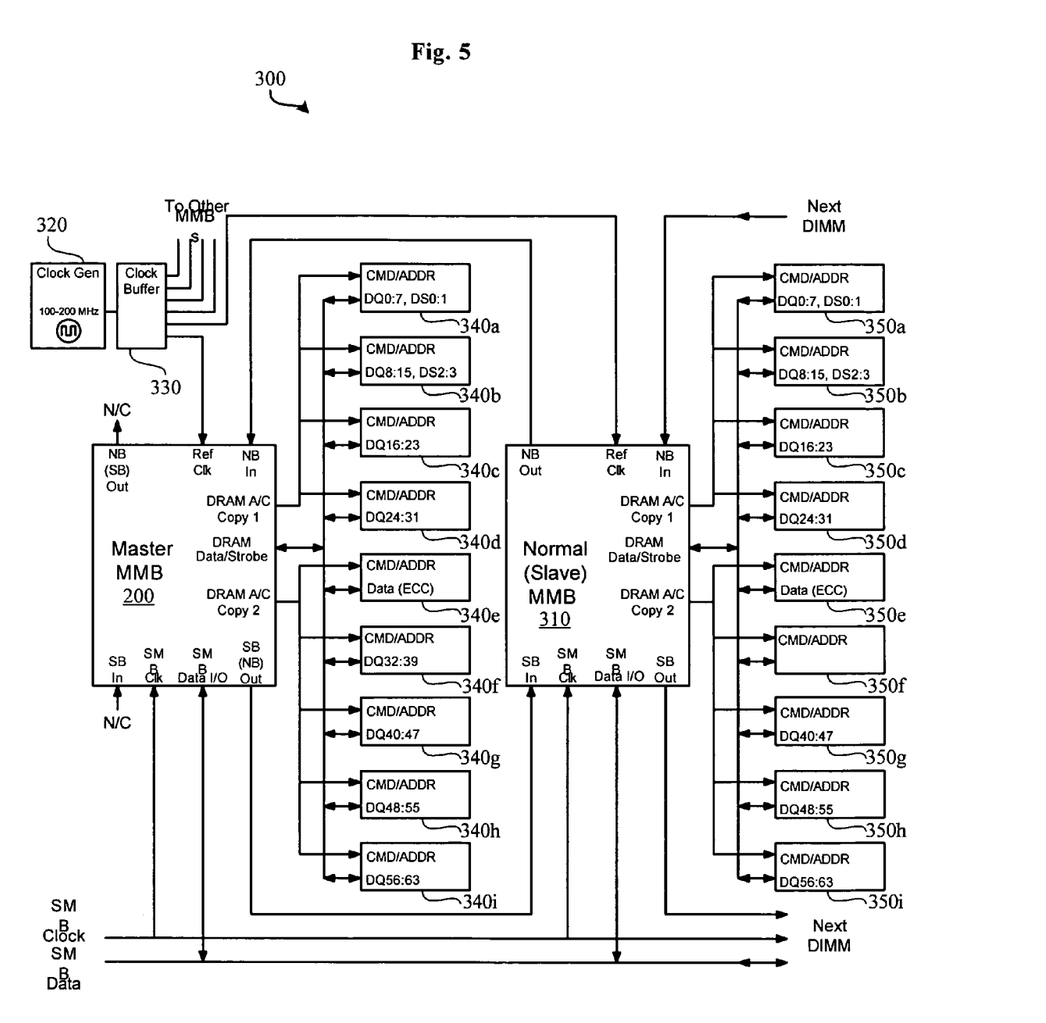
FIG. 5 schematically depicts two memory module buffers connected in a memory channel test configuration according to some embodiments of the present invention.

FIG. 5 shows a general electrical schematic 300 for test configurations employing MMBs such as MMB 200 of FIG. 4. An MMB 200 is designated as a "Master" MMB because its host-side memory channel is unconnected or at least unused during the test. A second MMB 310 is designated as a "Normal" or "Slave" MMB because, from its position, it is oblivious to the fact that the Master MMB is not connected to any host-side device. Other MMBs (not shown) can be connected downstream of MMB 310.

A memory channel is connected between MMB 200 and MMB 310. MMB 200 southbound (SB) memory channel output port SB Out is connected to MMB 310 southbound memory channel input port SB In. MMB 200 northbound (NB) memory channel input port NB In is connected to MMB 310 northbound memory channel output port NB Out.

An SMBus connection is also made to each MMB. An SMB Clock input signal is routed to an SMB Clk input port on each MMB. A bidirectional serial bus SMB Data is routed to an SMB Data I/O port on each MMB.

A clock generator circuit 320, e.g., capable of supplying a variable-frequency clock reference in the 100 to 200 MHz range, connects to a clock buffer 330. Clock buffer 330 creates multiple replicas of the clock reference, one for each MMB, and supplies each to the Ref Clk input of a respective MMB.

Although optional, Master MMB 200 can be connected to a bank of memory devices 340a–340i. Two copies of the DRAM Address/Command signals are made to alleviate bus loading problems. Copy 1 is distributed to memory devices 340a–340d, and Copy 2 is distributed to memory devices 340e–340i. A portion of the DRAM Data/Strobe signal bus is routed to each memory device. For instance, as shown, DQ0:7 and DS0:1 (Data bits 0 to 7 and data strobes 0 and 1) are routed to memory device 340a, DQ8:15 and DS2:3 are routed to memory device 340b, etc. Memory device 340e receives eight bits of data, which in normal host operation represent ECC (Error Correction Code) data corresponding to the data supplied on DQ0:63. For test operation, the ECC DRAM can be treated like the other DRAMs.

Normal MMB 310 connects to memory devices 350a–350i in the same manner that Master MMB 200 connects to memory devices 340a–340i.

Once test configuration 300 is connected in the manner shown in FIG. 5, the SMBus connection to Master MMB 200 can be used to initiate tests of: the memory device channel to, and memory devices 340a–340i, if included; the memory channel between Master MMB 200 and Normal MMB 310; once that memory channel is verified, the memory device channel to, and memory devices 350a–350i; once the memory channel is verified, additional memory channels to additional devices (not shown). Note that with an SMBus connection to Normal MMB 310, MMB 310 can directly test and report on the connection to its own memory devices, and can also be a "master" for testing a memory channel downstream of that device.

An alternative embodiment connects a dedicated chip, module, or high-speed test equipment to the southbound input and northbound outputs of MMB 200. Although cost-prohibitive in many applications, such a chip, module or equipment can be used to simulate a host controller by generating and receiving signals at the full data rate of the link. In this case all MMBs on the memory channel may be operated as slave devices.

Figure 6:
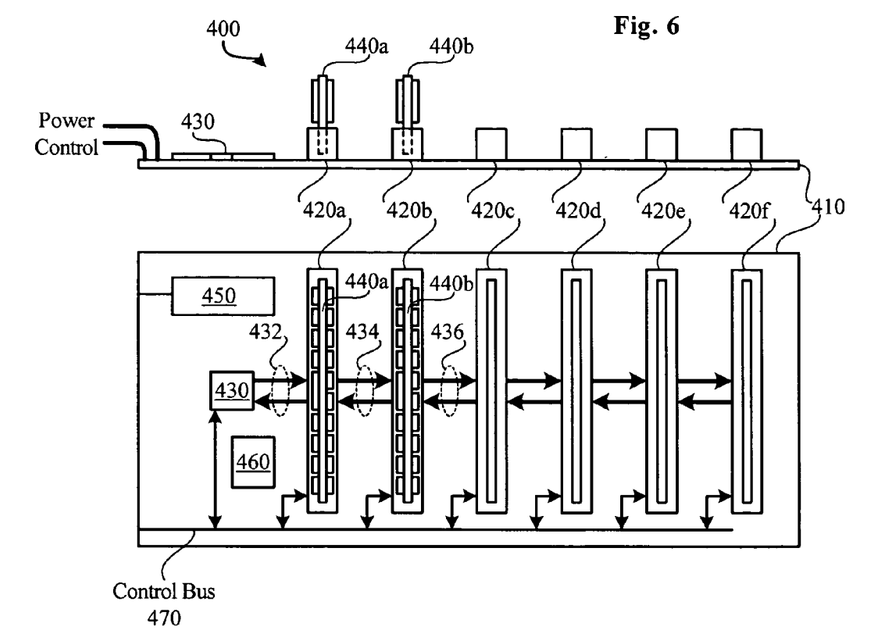
FIGS. 6 and 7 show two test fixture embodiments according to embodiments of the present invention.

FIG. 6 illustrates one physical layout for a memory test fixture according to an embodiment of the invention, in side view and top view. A circuit board 410 contains at least one, but preferably a plurality of buffered DIMM electrical connectors 420a–420f (the plurality can be any number supported by the overall system design). The circuit board also has a connection point for mounting an MMB 430 to circuit board 410 to serve as a Master MMB.

One or more buffered DIMMs under test (DIMMs 440a and 440b shown) are inserted into the DIMM electrical connectors to make a testable circuit. To test all DIMMs from Master MMB 430, the DIMMs should be inserted in the DIMM electrical connectors closest to the Master MMB. Master MMB 430 may be connected to DRAM devices on the test card or to a prior art DIMM to allow local storage of data (not shown).

Voltage regulators 450 and/or a clock generator 460 for the DIMMS and MMB 430 can be located on circuit board 410, or operating voltages and clock signals can be generated elsewhere and injected into appropriate ports on circuit board 410. Additional functions such as circuits to control timing, adjust reference voltages, count events, establish environmental conditions, or create other conditions of interest may be placed on the test fixture, connected to the test fixture, or otherwise placed in such a way as to allow control of the desired conditions.

Electrical traces are patterned on and/or in circuit board 410 to correspond to memory channels, a control bus, and the clock signal paths shown in FIG. 5. For instance, one set of traces link the connection point for the Master MMB 430 with DIMM electrical connector 420a to form a point-to-point memory channel 432 when MMB 430 is attached and a DIMM is inserted in electrical connector 420a. A second set of traces link other portions of DIMM electrical connector 420a with DIMM electrical connector 420b to form a point-to-point memory channel 434 when DIMMs are inserted in electrical connectors 420a and 420b.

Control bus traces 470, e.g., for an SMBus, are routed at least to the connection point for Master MMB 430. Preferably, this bus also connects to DIMM electrical connectors 420a–420f, as shown, so that SMBus control of DIMMs inserted in those connectors can also be achieved.

Test fixture 400 can be connected directly to a computer, test equipment, etc. to perform memory module and memory channel testing without a host memory controller in the test loop.

Figure 7:
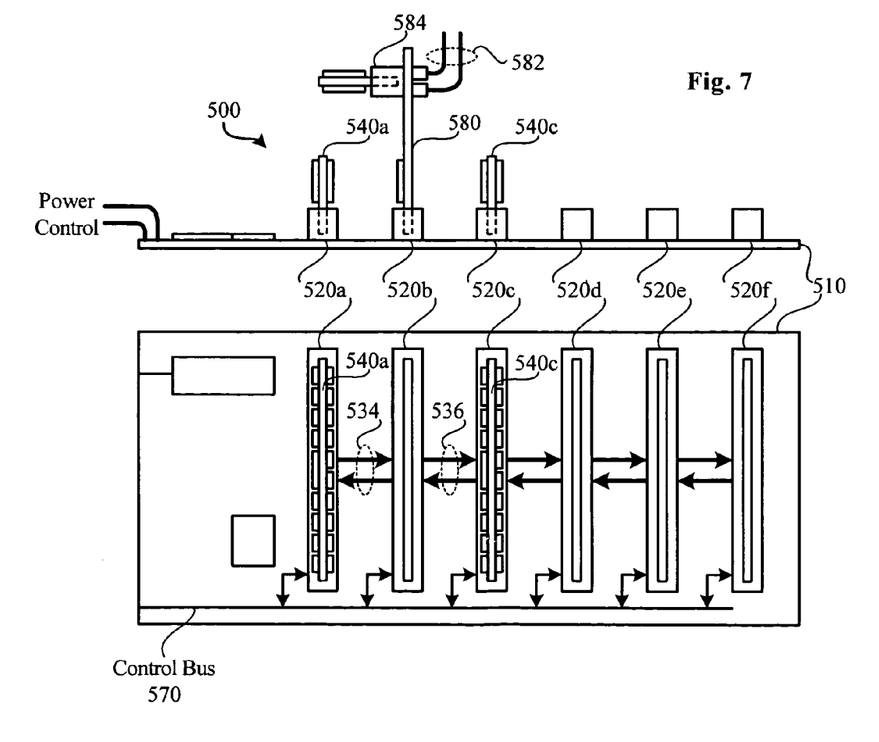

FIG. 7 shows an alternate layout for a test fixture 500 according to another embodiment of the invention, with a circuit board 510, DIMM electrical connectors 520a–520f, memory channel traces for memory channels (e.g., 534 and 536) between adjacent DIMM electrical connectors, and a control bus 570 connected to each DIMM electrical connector. Instead of mounting a Master MMB directly to a circuit board as shown in FIG. 6, the Master MMB in FIG. 7 is the buffer located on the module inserted in first occupied electrical connector slot, and thus the connection point for the Master MMB is that first occupied slot.

Three DIMMs 540a, 580, and 540c are shown inserted respectively in electrical connectors 520a, 520b, and 520c of test fixture 500. DIMM 580 is an optional test DIMM with a take-off point 582 for memory device channel traces. Take-off point 582 can be connected to lab equipment to observe memory transactions taking place on the memory device channel of memory module 580. To simplify the creation of such a take-off point, memory devices are not mounted on module 580. The buffer on test DIMM 580 will normally be incorporated into the memory channel as would any other DIMM. As with a normal DIMM, the southbound output port and northbound input port of the buffer on test DIMM 580 will normally be routed back to electrical connector 520b to complete the circuit to DIMMs in connectors 520c and beyond.

Since test DIMM 580 occupies an electrical connector such as 520b, it is desirable to place an additional electrical connector 584 on the test DIMM to allow a DIMM that would have otherwise been inserted in connector 520b to be placed in the memory channel. In this way the test fixture does not lose a possible DIMM connection point.

Figure 8:
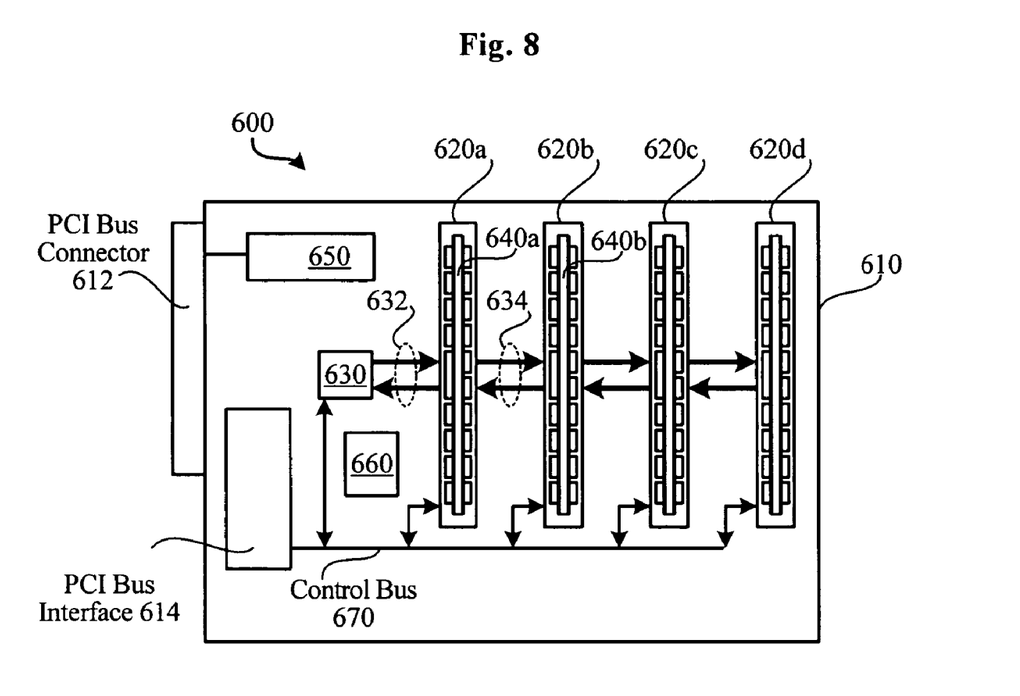
FIG. 8 shows a test fixture embodiment implemented on an expansion bus-compatible computer card.

Yet another test fixture embodiment 600 is illustrated in FIG. 8, with a circuit board 610, DIMM electrical connectors 620a–620d, a Master FBD buffer 630, memory channel traces 632, 634, etc., voltage control circuitry 650, a reference clock generator 660, and a control bus 670, all of which can be configured as their counterparts shown in FIG. 6. Circuit board 610 has a card-edge connector 612 for a PCI (Peripheral Component Interconnect) Bus, which is a well-known expansion bus found on many IBM-compatible personal computers. An optional PCI Bus Interface circuit 614 can be used to pass control signaling to a Master MMB 630 mounted on circuit board 610 over control bus 670. If an SMBus is used for control bus 670, connection can be made directly to a personal computer SMBus through card-edge connector 612.

When connected to a personal computer, the personal computer can pass test commands to MMB 630, or another memory buffer on an inserted buffered DIMM, through control bus 670. If the optional PCI Bus Interface circuit 614 is used, the test commands can be styled as PCI transactions initiated by the personal computer host processor. If connection is made directly to the personal computer SMBus, the host processor can initiate SMBus transactions to pass test commands to a memory buffer.

In many motherboard implementations, SMBus signals are available on one or more PCI bus interface connectors. This provides a convenient method to insert a circuit board such as 610. Alternatively, an interface card may be placed in an SMBus-enabled PCI slot. The SMBus or other desired signals may be routed from the interface card to a test fixture such as those in FIG. 6 or 7. With such a configuration, software can be loaded onto the personal computer to cause the processor to transmit appropriate commands over the appropriate bus, thereby causing a buffered memory module to exercise a memory channel between two memory modules, and possible memory on one or the other of the modules. The processor can receive results back over the control bus, which can be interpreted by software. Such software can be used to perform manual memory channel experiments and/or automated testing of buffered DIMM circuitry and devices. If supported by the test fixtures or interface cards a higher speed bus such as a proprietary bus or a standard bus such as USB may be used to communicate information to or from the DIMMs under test. This is useful if the test sequence requires or generates large amounts of data.

One of ordinary skill in the art will recognize that the concepts taught herein can be tailored to a particular application in many other advantageous ways. In particular, those skilled in the art will recognize that the illustrated embodiments are but one of many alternative implementations that will become apparent upon reading this disclosure. For instance, a wide variety of memory tests may be envisioned using the concepts disclosed herein, only a few of which are discussed specifically herein. The particular test sequence or sequences initiated using an embodiment is important from a testing viewpoint, but all such tests can be performed within the scope of the appended claims.

Many of the specific features shown herein are design choices. Channel and bus widths, signaling frequencies, DIMM layouts, number of memory devices, control bus protocols, etc., are all merely presented as examples. DIMMs can have multiple ranks of memory and/or memory modules stacks of multiple devices. Likewise, functionality shown embodied in a single integrated circuit or functional block may be implemented using multiple cooperating circuits or blocks, or vice versa. Such minor modifications are encompassed within the embodiments of the invention, and are intended to fall within the scope of the claims.

The preceding embodiments are exemplary. Although the specification may refer to "an" "one", "another", or "some" embodiment(s) in several locations, this does not necessarily mean that each such reference is to the same embodiment(s), or that the feature only applies to a single embodiment.

What is claimed is:

1. A buffered memory module test fixture comprising:
    a circuit board having
        a first electrical connector to receive a first buffered memory module under test,
        a master memory buffer connection point, and
        a first set of electrical traces, corresponding to a first point-to-point memory channel, connecting the electrical connector with the master memory buffer connection point;
    a master memory buffer having a host-side memory port; and
    a control bus routed to the master memory buffer connection point, to propagate control signals to the master memory buffer to cause the master memory buffer to exercise the memory channel, the host-side memory port being disconnected during such exercise.

2. The buffered memory module test fixture of claim 1, wherein the master memory buffer is mounted to the circuit board.

3. The buffered memory module test fixture of claim 1, wherein the master memory buffer connection point is a memory module electrical connector, and wherein the master memory buffer is mounted on a master memory module card inserted into the memory module electrical connector.

4. The buffered memory module test fixture of claim 3, wherein the master memory module card further comprises a plurality of memory devices connected to the master memory buffer by a memory device channel.

5. The buffered memory module test fixture of claim 1, wherein the control bus is a system management bus.

6. The buffered memory module test fixture of claim 5, wherein the circuit board is configured for edge insertion in a computer peripheral bus slot, with the system management bus routed to the insertion edge of the card for connection to a computer system management bus.

7. The buffered memory module test fixture of claim 1, further comprising at least one voltage regulator to supply operating power to a memory module and a master memory buffer during test, and a clock generator to supply a reference clock signal to the memory module and the master memory buffer during test.

8. The buffered memory module test fixture of claim 1, further comprising the buffered memory module under test, comprising:
    a module circuit board having a set of memory device channel traces with a take-off point for monitoring signals on at least selected memory device channel traces;
    a memory buffer connected to one end of the memory device channel traces;
    a memory module connector connected to the other end of the memory device channel traces; and
    a memory module inserted in the memory module connector.

9. The buffered memory module test fixture of claim 8, further comprising additional circuitry or equipment connected to the take-off point to store or analyze memory channel behavior.

10. The buffered memory module test fixture of claim 8, further comprising a proprietary or standard connection to additional circuitry or equipment.

11. The buffered memory module test fixture of claim 1, further comprising:
    a second electrical connector to receive a second buffered memory module under test; and
    a second set of electrical traces, corresponding to a second point-to-point memory channel, connecting the second electrical connector with the first electrical connector.

12. The buffered memory module test fixture of claim 11, wherein the control bus is further routed to the first electrical connector, to propagate control signals to a first buffered memory module, inserted in the first electrical connector, to cause that memory module to exercise the second memory channel independent of the first memory channel.

13. A memory module buffer comprising:
    a host-side memory channel port, a downstream memory channel port, a control bus port, and a memory device port;
    transfer circuitry to relay memory channel data between the memory channel ports;

memory access circuitry to reformat and relay data between the host-side memory channel port and the memory device port; and control circuitry to cause the memory module buffer to send and receive memory channel data over the downstream memory channel port in response to test commands received at the control bus port.

14. The memory module buffer of claim 13, the control circuitry further having the capability to cause the memory module buffer to send and receive data over the memory device port in response to test commands received at the control bus port.

15. The memory module buffer of claim 13, wherein the control circuitry further comprises report circuitry to transmit test results from the control bus port.

16. A buffered memory module comprising:
a plurality of memory devices;
a host-side memory channel port, a downstream memory channel port, a control bus port, and a memory device channel connected to the memory devices;
transfer circuitry to relay memory channel data between the host-side and downstream memory channel ports;
memory access circuitry to reformat and relay data between the host-side memory channel port and the memory device channel; and
control circuitry to send and receive memory channel data over the downstream memory channel port in response to test commands received at the control bus port.

17. The buffered memory module of claim 16, the control circuitry further having the capability to cause data transfers with the memory devices in response to test commands received at the control bus port.

18. The buffered memory module of claim 16, wherein the control circuitry further comprises report circuitry to transmit test results from the control bus port.

19. A method of testing a memory channel independent of a host memory channel, the method comprising:
connecting first and second memory module buffers to opposite ends of the memory channel;
issuing a control command to the first memory module buffer over a relatively low-speed bus independent of the host memory channel; and
in response to issuance of the control command, the first memory module buffer initiating a memory transaction over the memory channel to the second memory module buffer.

20. The method of claim 19, further comprising:
the second memory module buffer performing the initiated memory transaction; and
the first buffer reporting a result of the memory transaction over the low-speed bus.

21. The method of claim 19, wherein the memory channel comprises multiple point-to-point memory segments, each terminated by a memory module buffer at each end, the method further comprising the memory module buffers intermediate the first and second memory module buffers relaying the memory transaction between the first and second memory module buffers.

22. The method of claim 19, further comprising locating the second memory module buffer on a module card with a connector for a memory module, using a memory module inserted in the connector as memory for the module card, and monitoring signals passing to the memory module during the memory transaction.

23. The method of claim 19, wherein the first and second buffers are respectively located on first and second memory modules inserted as system memory in a computer, the method comprising the computer initiating the control command to test the memory channel independent of a host memory channel.

24. The method of claim 19, wherein connecting first and second memory module buffers to opposite ends of the memory channel comprises mounting the first memory module buffer on a test fixture, connecting the first memory module buffer via a set of memory channel traces to a memory module connector on the test fixture, and inserting a memory module containing the second memory module buffer in the connector.

25. The method of claim 19, further comprising the first memory module buffer collecting data from the low-speed channel, and then bursting that data to the second memory module buffer at memory channel operating speed.

26. An article of manufacture comprising computer-readable media containing instructions that, when executed by a processor, cause that processor to perform a method comprising:
transmitting commands over a system management bus to a first buffered memory module to cause that buffered memory module to exercise a memory channel between the first buffered memory module and a second buffered memory module; and
receiving results of the transmitted commands from the first buffered memory module over the system management bus.

27. The article of manufacture of claim 26, wherein transmitting commands comprises at least one of reading and writing data to memory located on the second buffered memory module.

28. The article of manufacture of claim 26, the method further comprising selecting one of a plurality of buffered memory modules connected to the system management bus as the first buffered memory module, and addressing the transmitted commands to the selected memory module.

29. A computing device comprising:
a host memory controller;
at least first and second buffered memory modules;
a first point-to-point memory channel connecting the host memory controller to the first buffered memory module;
a second point-to-point memory channel connecting the first buffered memory module to the second buffered memory module;
a relatively low-speed bus coupled to the first buffered memory module; and
test circuitry on the first buffered memory module to receive commands over the low-speed bus and respond by issuing memory commands over the second point-to-point memory channel to the second buffered memory module.

30. The computing device of claim 29, further comprising:
a third buffered memory module;
a third point-to-point memory channel connecting the second buffered memory module to the third buffered memory module; and
test circuitry on the second buffered memory module to receive commands over the low-speed bus and respond by issuing memory commands over the third point-to-point memory channel to the third buffered memory module.

31. A memory module comprising:
a plurality of memory devices;
a host-side communications link port and a downstream communications link port;

transfer circuitry to relay memory channel data between the host-side communications link port and the memory devices; and self-test circuitry to facilitate one or more self tests selected from the group of tests consisting of a host-side communications link test between the memory module and a second device coupled to the host-side communications port, a downstream communication link test between the memory module and a second memory module, and a test of the plurality of memory devices.

32. The memory module of claim 31, further comprising a control bus port, the memory module having the capability to control the self-test circuitry from the control bus port.

33. A buffered memory module test fixture comprising:
a circuit board having
a first electrical connector to receive a first buffered memory module under test,
a master memory buffer connection point, and
a first set of electrical traces, corresponding to a first point-to-point memory channel, connecting the electrical connector with the master memory buffer connection point;
a control bus routed to the master memory buffer connection point, to propagate control signals to a master memory buffer to cause the master memory buffer to exercise the memory channel; and
a buffered memory module under test, comprising:
a module circuit board having a set of memory device channel traces with a take-off point for monitoring signals on at least selected memory device channel traces;
a memory buffer connected to one end of the memory device channel traces;
a memory module connector connected to the other end of the memory device channel traces; and
a memory module inserted in the memory module connector.

34. The buffered memory module test fixture of claim 33, further comprising additional circuitry or equipment connected to the take-off point to store or analyze memory channel behavior.

35. The buffered memory module test fixture of claim 33, further comprising a proprietary or standard connection to additional circuitry or equipment.

36. A buffered memory module test fixture comprising:
a circuit board having
a first electrical connector to receive a first buffered memory module under test,
a second electrical connector to receive a second buffered memory module under test,
a master memory buffer connection point,
a first set of electrical traces, corresponding to a first point-to-point memory channel, connecting the electrical connector with the master memory buffer connection point,
a second set of electrical traces, corresponding to a second point-to-point memory channel, connecting the second electrical connector with the first electrical connector; and
a control bus routed to the master memory buffer connection point, to propagate control signals to a master memory buffer to cause the master memory buffer to exercise the memory channel.

37. The buffered memory module test fixture of claim 36, wherein the control bus is further routed to the first electrical connector, to propagate control signals to a first buffered memory module, inserted in the first electrical connector, to cause that memory module to exercise the second memory channel independent of the first memory channel.

* * * * *